United States Patent
Wirz et al.

(10) Patent No.: US 9,741,612 B2
(45) Date of Patent: Aug. 22, 2017

(54) SEMICONDUCTOR DEVICES AND METHODS FOR BACKSIDE PHOTO ALIGNMENT

(71) Applicant: Micron Technology, Inc., Boise, ID (US)

(72) Inventors: Brandon P. Wirz, Kuna, ID (US); Keith Ypma, Boise, ID (US); Christopher J. Gambee, Caldwell, ID (US); Jaspreet S. Gandhi, Boise, ID (US); Kevin M. Dowdle, Pocatello, ID (US); Irina Vasilyeva, Boise, ID (US); Yang Chao, Boise, ID (US); Jon Hacker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/050,858

(22) Filed: Feb. 23, 2016

(65) Prior Publication Data
US 2016/0172242 A1    Jun. 16, 2016

Related U.S. Application Data

(62) Division of application No. 14/281,362, filed on May 19, 2014, now Pat. No. 9,299,663.

(51) Int. Cl.
| | |
|---|---|
| *H01L 21/768* | (2006.01) |
| *H01L 23/544* | (2006.01) |
| *H01L 21/683* | (2006.01) |
| *H01L 23/48* | (2006.01) |
| *H01L 21/027* | (2006.01) |
| *H01L 21/311* | (2006.01) |

(52) U.S. Cl.
CPC .... *H01L 21/76897* (2013.01); *H01L 21/0274* (2013.01); *H01L 21/31111* (2013.01); *H01L 21/6836* (2013.01); *H01L 21/76843* (2013.01); *H01L 21/76871* (2013.01); *H01L 21/76898* (2013.01); *H01L 23/481* (2013.01); *H01L 23/544* (2013.01); *H01L 2223/5442* (2013.01); *H01L 2223/54426* (2013.01); *H01L 2223/54453* (2013.01); *H01L 2223/54473* (2013.01); *H01L 2924/0002* (2013.01)

(58) Field of Classification Search
CPC ............ H01L 21/76898; H01L 23/481; H01L 2924/01078; H01L 2924/01079; H01L 2225/06542

See application file for complete search history.

(56) References Cited

U.S. PATENT DOCUMENTS

| | | | |
|---|---|---|---|
| 8,987,902 B2 | 3/2015 | Miki | |
| 2012/0133010 A1* | 5/2012 | Komukai | ............ H01L 27/1463 257/432 |
| 2015/0333014 A1 | 11/2015 | Wirz | |

* cited by examiner

*Primary Examiner* — Quoc Hoang
(74) *Attorney, Agent, or Firm* — Perkins Coie LLP (57) ABSTRACT

Various embodiments of microelectronic devices and methods of manufacturing are described herein. In one embodiment, a method for aligning an electronic feature to a through-substrate via includes forming a self-aligned alignment feature having a wall around at least a portion of the TSV and aligning a photolithography tool to the self-aligned alignment feature. In some embodiments, the self-aligned alignment feature is defined by the topography of a seed material at a backside of the device.

13 Claims, 13 Drawing Sheets

SEMICONDUCTOR DEVICES AND METHODS FOR BACKSIDE PHOTO ALIGNMENT

CROSS-REFERENCE TO RELATED APPLICATION

This application is a divisional of U.S. application Ser. No. 14/281,362 filed May 19, 2014, which is incorporated herein by reference in its entirety.

TECHNICAL FIELD

The present technology is related to aligning electrical features to through-substrate vias that extend through the substrates of semiconductor devices. In particular, some embodiments of the present technology are related to backside alignment of under-bump metallization ("UBM") structures to through-silicon vias ("TSVs").

BACKGROUND

Photolithography is a process commonly used in semiconductor fabrication for selectively removing portions of a thin film from or depositing portions of a film onto discrete areas of a surface of a semiconductor wafer. A typical photolithography process includes spin coating a layer of a light-sensitive material (commonly referred to as a "photoresist") onto the surface of the semiconductor wafer. The semiconductor wafer is then exposed to a pattern of light that chemically modifies a portion of the photoresist incident to the light. The process further includes removing one of the incident portion or the non-incident portion from the surface of the semiconductor wafer with a chemical solution (e.g., a "developer") to form a pattern of openings in the photoresist on the wafer. Subsequently, portions of the thin film on the surface of the semiconductor wafer can be selectively removed from or deposited onto the surface of the wafer through the openings of the photoresist mask. The photolithography process can be repeated to form layers of microelectronic features on or in the semiconductor wafer.

In the foregoing process, new patterns are aligned with existing patterns of features already on the semiconductor wafer. If a new pattern is not aligned accurately, the new pattern may overlap and/or otherwise interfere with existing patterns on the semiconductor wafer, which may render the newly-formed features inoperable. To ensure proper alignment, conventional processing methods utilize multiple fiducials on the semiconductor wafer at various stages throughout processing. As used herein, a "fiducial" refers to a set of fiducial marks that can be identified by a photolithography tool. For example, photolithography tools use fiducials as reference points or patterns for alignment with respect to the semiconductor wafer before exposing the surface of a wafer to a pattern of light.

Figure 1A:
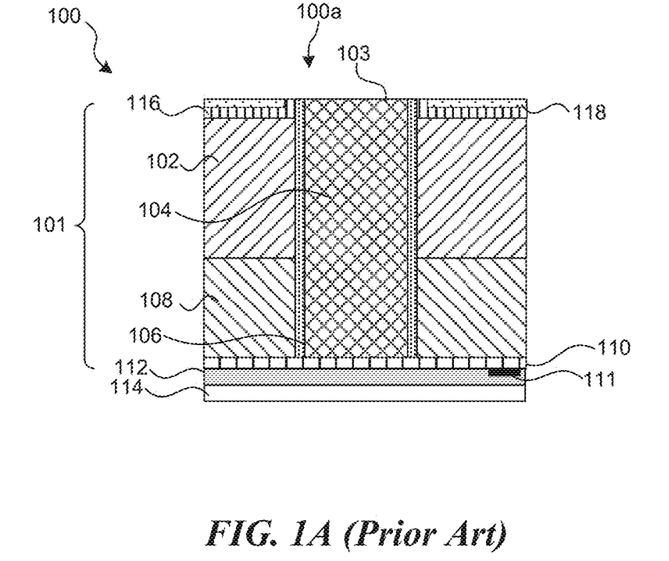
FIGS. 1A-1F are schematic cross-sectional views of various stages in a method for aligning a UBM structure to a TSV according to the prior art.

FIGS. 1A-1F are partially schematic cross-sectional views illustrating a portion of a workpiece 100 in a prior art method for aligning a UBM structure to a TSV utilizing at least two fiducials. As shown in FIG. 1A, the workpiece 100 includes a semiconductor device 101 (only a portion shown) removably attached to a temporary carrier 114 via an adhesive material 112. The semiconductor device 101 includes a redistribution structure 110, a dielectric material 108 on the redistribution structure 110, and a substrate 102 on the dielectric material 108. The semiconductor device 101 further includes a plurality of TSVs 104 (only one shown) extending from the redistribution structure 110 through the dielectric material 108 and the substrate 102 to a backside 100a of the device 101. FIG. 1A shows the semiconductor device 101 after passivation materials 116 and 118 have been deposited on the backside 100a surface of the device 201 and subsequently planarized to expose a backside surface 103 of the TSV 104.

As shown in FIG. 1A, the workpiece 100 includes a first fiducial 111 (shown schematically) positioned at a frontside of the device 101 between the carrier 114 and the redistribution structure 110. The first fiducial 111 is used during various processing steps to align a photolithography tool to the backside 100a of the device 101. Using infrared illumination, a photolithography tool positioned at the backside 100a of the device 101 detects the first fiducial 111 through the substrate 102, dielectric material 108, and redistribution structure 110. The first fiducial 111 provides a reference point to align the photolithography tool to the workpiece 100. Certain materials subsequently deposited on the backside of the device 101 are opaque, however, which limits the photolithography tool and prevents proper alignment with the device 101 for subsequent processing steps.

Figure 1B:
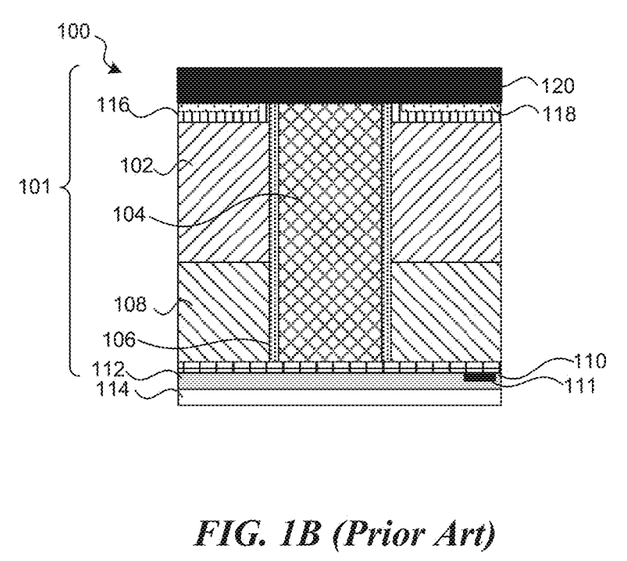
Figure 1C:
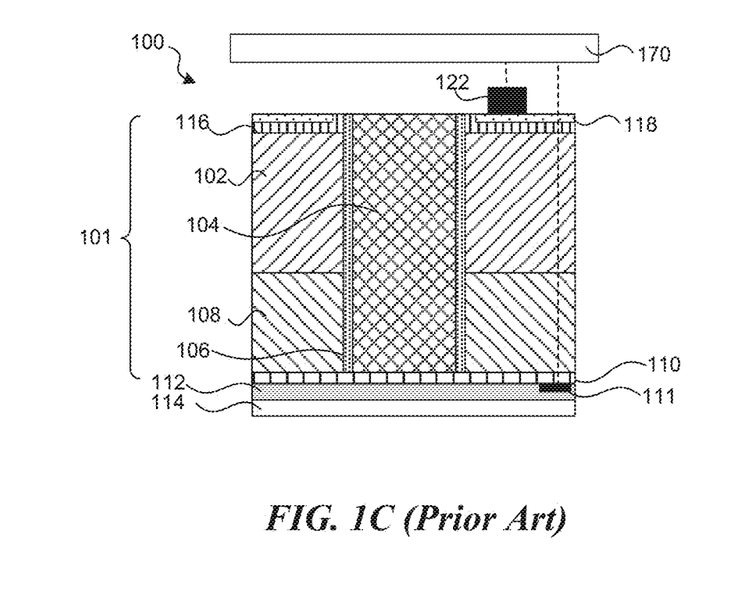
Figure 1D:
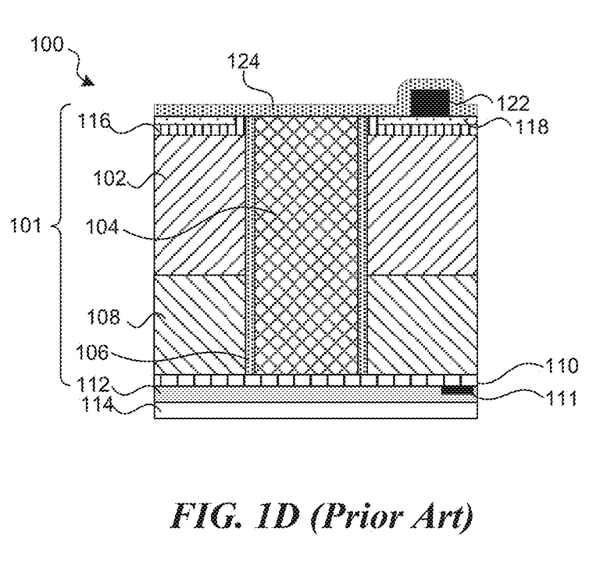

Conventional methods address this problem by including a second fiducial 122 at the backside of the device 101, as shown in FIGS. 1B and 1C. Referring first to FIG. 1B, a transparent photo-sensitive polymer material 120 is deposited on a backside surface of the device 101. Using IR illumination, the photolithography tool 170 identifies the first fiducial 111 to align the pattern for the second fiducial 122. As shown in FIG. 1C, the polymer material 120 is patterned and developed to form the second fiducial 122 at the backside surface of the device 101. An opaque seed layer 124 made from copper or another seed or barrier material can then be formed on the second fiducial 122 and the backside of the device 101.

Figure 1E:
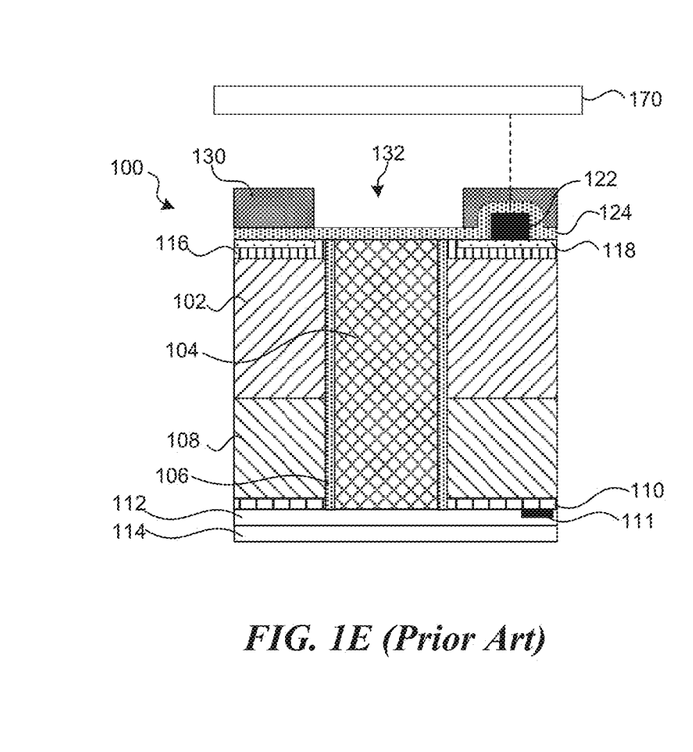
Figure 1F:
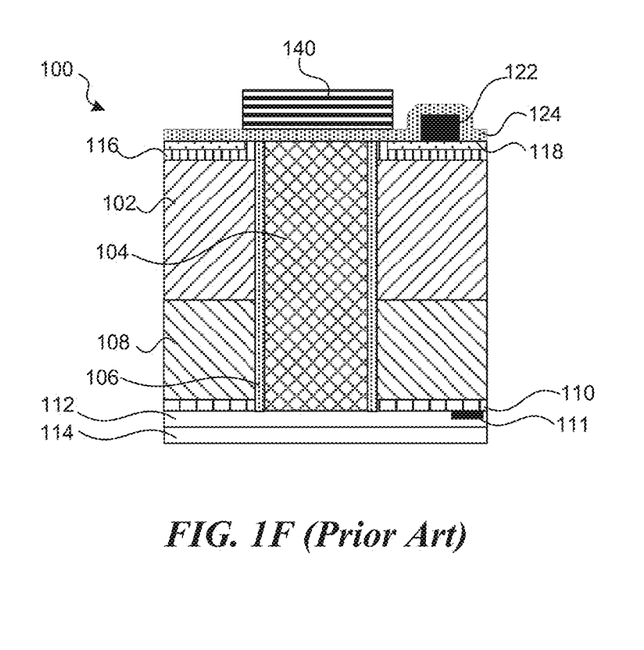

As shown in FIG. 1E, the photolithography tool 170 then aligns the pattern for a UBM structure based on the protuberance in the seed layer 124 created by the second fiducial 122 to form an opening 132 through a resist material 130 on the backside of the device 101. As shown in FIG. 1F, a UBM structure 140 is then formed in the opening 132 and remaining resist material 130 is removed.

The above-described method can be lengthy and expensive, which is exacerbated by the deposition and patterning of the second fiducial. Accordingly, several improvements for reducing the time and cost of these devices and methods would be desirable.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Several embodiments of the present technology are described below with reference to processes for aligning electrical features to semiconductor substrates. Many details of certain embodiments are described below with reference to semiconductor devices. The term "semiconductor device" is used throughout to include a variety of articles of manufacture, including, for example, individual integrated circuit dies, imager dies, sensor dies, and/or dies having other semiconductor features. Several of the processes described below may be used to align electrical features on and/or in an individual die or a plurality of dies. The wafer or wafer portion (e.g., wafer form) can be unsingulated silicon or a repopulated carrier wafer. The repopulated carrier wafer can include an adhesive material (e.g., a flexible adhesive) surrounded by a generally rigid frame having a perimeter shape comparable to that of an unsingulated wafer, and singulated elements (e.g., dies) surrounded by the adhesive.

In the following description, common acts and structures are identified by the same reference numbers. Although only particular processing operations and associated structures for aligning UBM structures to TSVs are illustrated in FIGS. 2A-8, in certain embodiments the methods can be used in other processes for forming other components. For example, several embodiments of the present technology can be used to form lenses, mirror materials, support structures, conductive interconnects, and/or other suitable mechanical/electrical components (not shown), such as transistor(s), diode(s), capacitor(s), or another suitable solid-state components. As shown in FIGS. 2A-8, several embodiments of methods for aligning an electronic feature to a TSV that extends through a semiconductor substrate on a microelectronic device can include exposing a portion of the TSV at a backside of the device. The portion of the TSV can be surrounded by a passivation material. The method also includes changing the height of at least one of the TSV or the passivation material relative to the other such that a topographical relief is formed between the TSV and a portion of the passivation material around at least a portion of the TSV at the backside of the device. The method can further include forming an alignment feature from the topographical relief. For example, the alignment feature can be formed by conforming a seed material to the topographical relief.

Figure 2A:
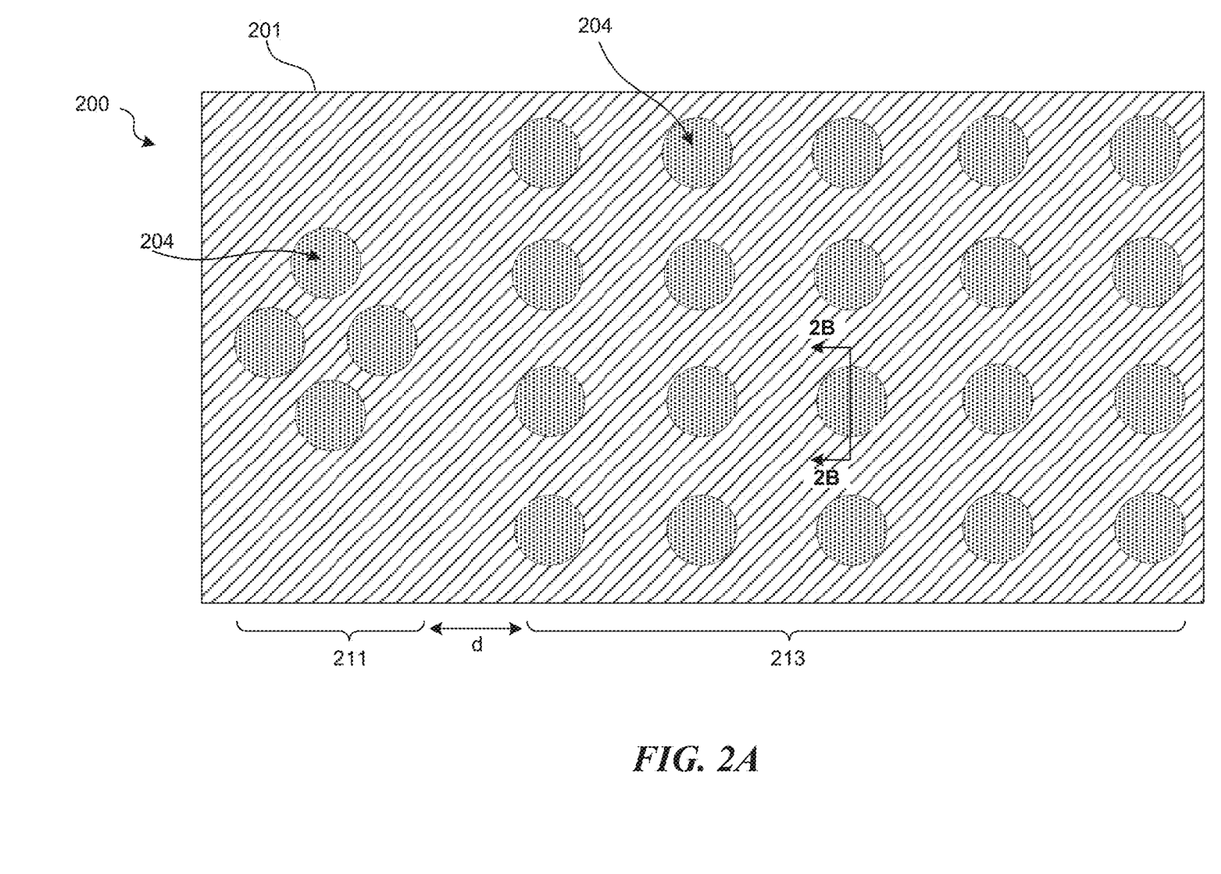
FIG. 2A is a schematic top view of a microelectronic substrate undergoing a process for aligning an electrical feature to a TSV in accordance with embodiments of the technology.
Figure 2B:
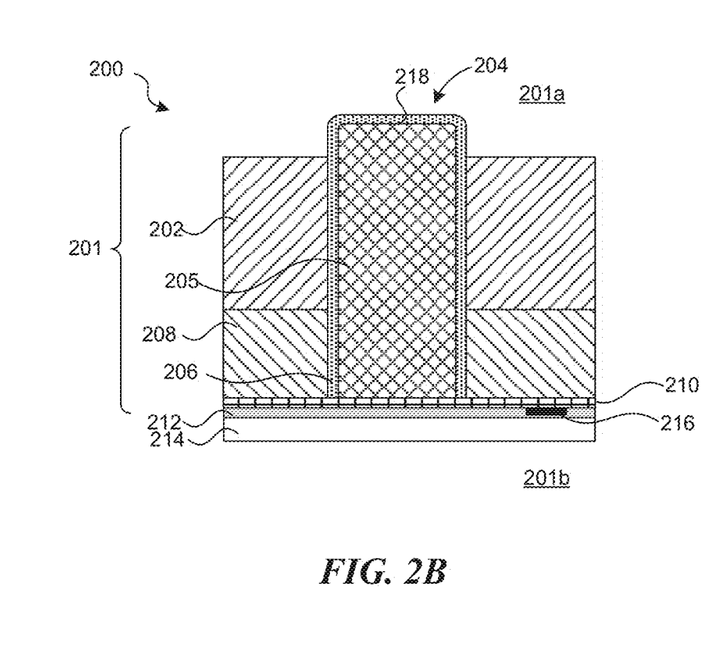
FIGS. 2B-2H are schematic cross-sectional side views of a portion of the microelectronic substrate shown in FIG. 2A undergoing a process for aligning an electrical feature to a TSV in accordance with embodiments of the technology.

FIGS. 2A-2K are partially schematic views illustrating a microelectronic workpiece 200 in a method for aligning an electrical feature, such as a UBM structure, to a TSV. FIG. 2A is a top view of the workpiece 200, and FIG. 2B is a cross-sectional end view of a portion of the workpiece 200 shown in FIG. 2A. Referring to FIG. 2B, the workpiece 200 can include a semiconductor device 201 removably attached to a temporary carrier 214 via an adhesive material 212. The semiconductor device 201 can have a backside 201a and a frontside 201b opposite the backside 201a. The device 201 can further include a redistribution structure 210, a dielectric region 208 on a backside of the redistribution structure 210, and a substrate 202 on a backside of the dielectric region 208. The dielectric region 208 can include a stack of dielectric materials, such as silicon oxide material or other suitable dielectric materials.

The device 201 can further include a plurality of TSVs 204 (only one shown in FIG. 2B), each of which extend through the dielectric region 208 and substrate 202 from the redistribution structure 210 to the backside 201a of the device 201. Referring to FIG. 2A, the semiconductor device 201 can include a first group 211 of TSVs and a second group 213 of TSVs separated from the first group 211 along the semiconductor device 201 by a distance d. The first group 211 can have an arrangement that is distinct from that of the second group 213. For example, as shown in FIG. 2A, the first group 211 of TSVs can be individual fiducial marks arranged in the shape of a cross to provide a fiducial when completed, while the second group 213 of TSVs can be electrical connectors arranged in a rectangular array. The first group 211 of TSVs can be electrically active to provide electrical connectors, or they can be electrically isolated (e.g., dummy TSVs). Such dummy TSVs can provide thermal pathways to cool the device. In other embodiments, the first group 211 and/or second group 213 can have any suitable configuration and/or positioning.

Referring back to FIG. 2B, each of the TSVs 204 can include a conductive material 205, a dielectric liner 206, and a projection 218 that protrudes from a backside surface of the substrate 202. In the illustrated embodiment, the TSVs 204 have a circular cross-sectional area. In other embodiments, the TSVs 204 can have any suitable cross-sectional area (e.g., ellipsis, oval, triangular, square, rectangular, polygonal, etc.). Additionally, the dielectric liner 206 can be positioned between the conductive material 205 and the semiconductor substrate 202 to electrically isolate the corresponding TSV 204 from the semiconductor material. The dielectric liner 206 can have a thickness from about 0.05 microns to about 1.5 microns, or from about 0.1 microns to about 0.4 microns. Suitable materials for the dielectric liner 206 can include silicon dioxide, among others.

Referring still to FIG. 2B, the device 201 can include a frontside fiducial 216 at the redistribution structure 210 or within the substrate 202 or dielectric region 208. The fiducial 216 provides a reference for aligning various frontside processes or prior backside processes. For example, a photolithography tool can use the fiducial 216 for alignment of subsequent patterning and/or processing of the workpiece 200. Although the fiducial 216 is generally not visible at the backside using visible radiation, it can be detected using infrared radiation or other radiation. The substrate 202, for example, can be silicon, which is generally transparent to infrared light. However, as explained above, the fiducial 216 cannot provide a reference point for aligning subsequent backside processes after the backside 201a has been covered by an opaque material.

Figure 2C:
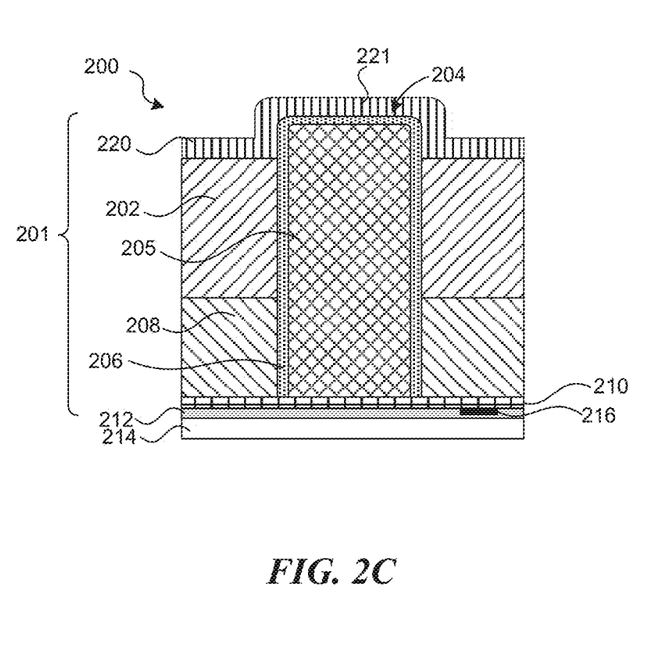

FIG. 2C is a cross-sectional side view of a portion of the workpiece 200 after a first passivation material 220 has been deposited on an exposed backside surface of the substrate 202 and the projecting portions 218 of the TSVs 204. As illustrated, the first passivation material 220 conforms to a backside surface of the substrate 202 and the dielectric liner 206 over the projecting portions 218 of the TSVs 204. The portions of the first passivation material 220 covering the projecting portions 218 of the TSVs 204 form topographical features or projections 221 at the backside of the device 201. In some embodiments, the first passivation material 220 can have a thickness greater than about 0.2 µm. For example, in particular embodiments, the first passivation material 220 thickness can be about 1.0 µm.

Figure 2D:
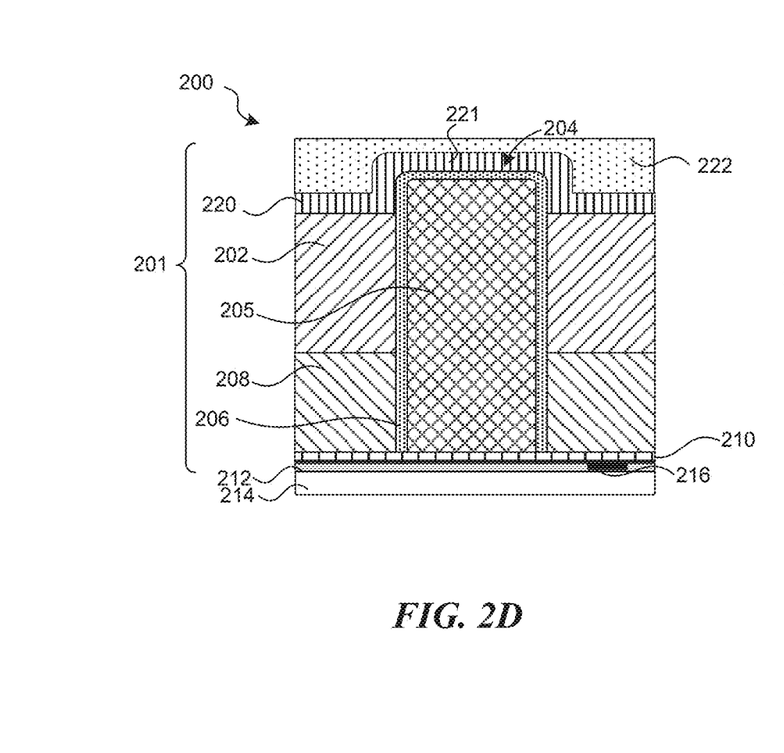

FIG. 2D shows a portion of the workpiece 200 after a second passivation material 222 has been deposited on the first passivation material 220. The second passivation material 222 can have a thickness between about 0.1 µm to about 0.9 µm. In some embodiments, the second passivation material 222 thickness can be between about 0.1 µm to about 4 µm. In a particular embodiment, the second passivation material 222 thickness can be between about 0.2 µm to about 0.5 µm.

The first and second passivation materials 220, 222 can be deposited in a low-temperature passivation process, such as a PECVD process. In one embodiment, the first passivation material 220 is a silicon nitride film ("SiN") and the second passivation material 222 is a tetraethyl orthosilicate ("TEOS") (or vice versa). In other embodiments, other suitable materials may form the one or both of the passivation materials, including polysilicon. The first and second passivation materials 220, 222, for example, can be selected so that the first passivation material 220 can be selectively removed from the device relative to the second passivation material. Also, in some embodiments, the semiconductor device 201 can include more than two passivation materials, or a single film of passivation material.

Figure 2E:
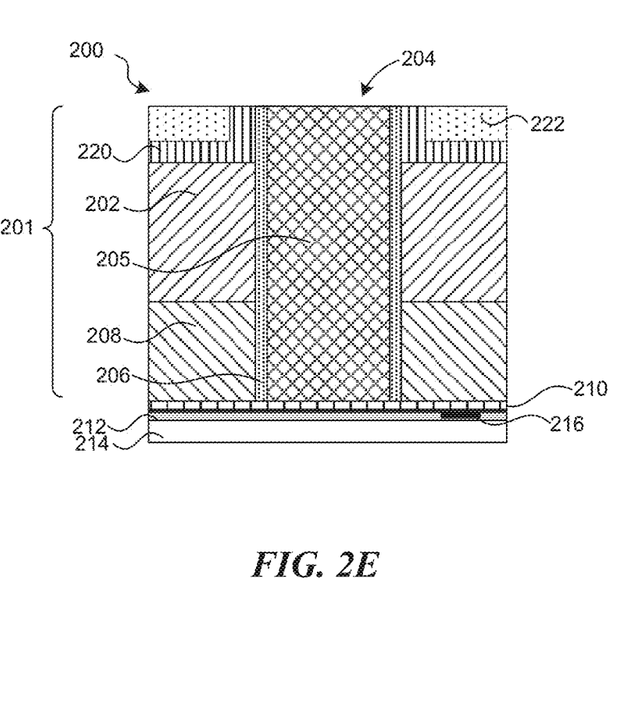

FIG. 2E is a cross-sectional side view of the workpiece 200 after the first and second passivation materials 220, 222, including the topographical feature 221 (FIGS. 2C and 2D), have been planarized by chemical-mechanical planarization (CMP) (e.g., oxide CMP), backgrinding, fly-cutting, or other suitable processes. The planarization process exposes the TSVs 204 through the first and second passivation materials 220, 222. In this embodiment, a portion of the dielectric liner 206 is also removed from each of the TSVs 204.

Figure 2F:
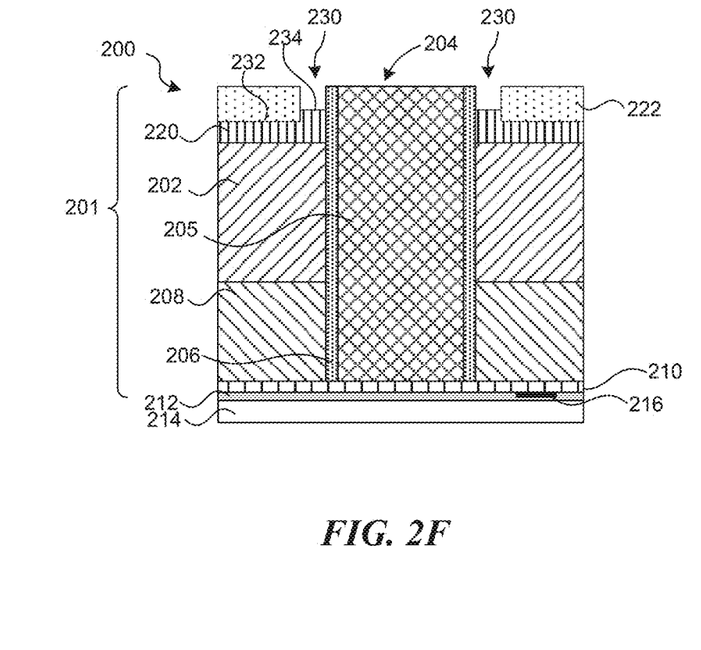

FIG. 2F shows the workpiece 200 after a pre-metallization deposition ("PMD") clean. The PMD clean can include cleaning the copper oxide from the exposed surface of the TSVs 204. The PMD clean can also selectively etch the exposed portion of the first passivation material 220 without removing as much of the second passivation material 222. As shown in FIG. 2F, the first passivation material 220 (e.g., SiN) can have an etching rate greater than that of the second passivation material 222 (e.g., PECVD TEOS Oxide or TEOS Oxide) such that the PMD clean forms an indentation or recess 230 in the portions of the first passivation material 220 around the perimeter of each of the TSVs 204. For example, the first passivation material 220 can have a backside surface that includes a first portion 232 covered by the second passivation material 222 and a second portion 234 that surrounds each of the TSVs 204 (and dielectric liners 206 if present). The second portion 234 can be positioned at a different plane than the backside surfaces of the TSVs 204 and the second passivation material 222. Accordingly, for each TSV 204, the second portion 234, the second passivation material 222, and the TSV 204 together define the walls of the indentation 230 (about 120 Å deep) around the corresponding TSV 204. As such, etching the first and second passivation materials 220, 222 at different etching rates produces a unique recessed topography at the backside surface of the device 201 that is self-aligned with each of the TSVs 204 (e.g., aligned without a photo-pattern) for later use by a photolithography tool to align a pattern for subsequent processing steps. As a result, the photolithography tool may align itself to the workpiece 200 based solely on the first group 211 of TSVs 204 (FIG. 2A) during subsequent alignment procedures.

Figure 2G:
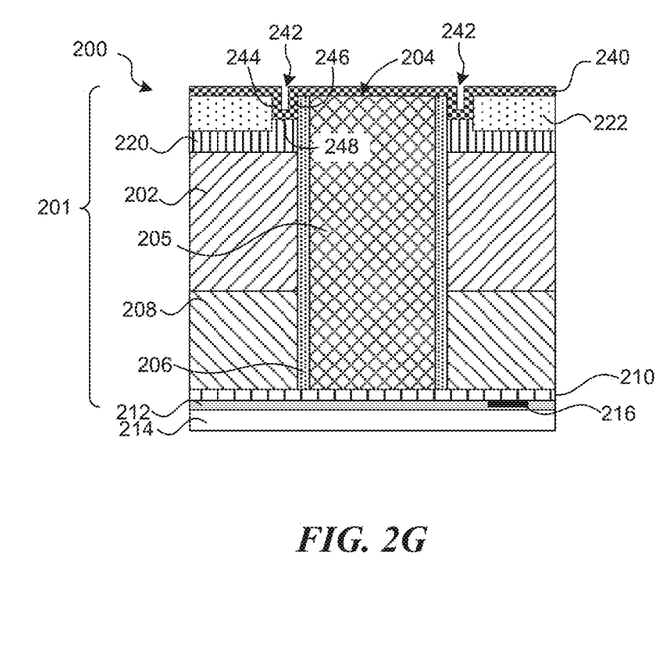

FIG. 2G is a cross-sectional side view of the workpiece 200 after a seed/barrier structure 240 has been deposited on a backside surface of the device 201. The seed/barrier structure 240 can be deposited by physical vapor deposition ("PVD") or other suitable processes. As illustrated in FIG. 2G, the seed/barrier structure 240 generally conforms to the backside topography of the device 201 such that a portion of the seed/barrier structure 240 forms grooves 242 that correspond to the positions of the indentations 230. The grooves 242 in the seed/barrier structure 240 create a distinct topographical feature having a wall at the backside of the device 201 that provides a self-aligned alignment feature for subsequent processing steps. Such self-aligned alignment features on the backside obviate the time and materials needed to form a second fiducial on the backside of the device when an opaque seed/barrier structure is used.

In some embodiments, each of the grooves 242 can be defined by a first portion 244 of the seed/barrier structure 240 in contact with the second passivation material 222, a second portion 246 of the seed/barrier structure 240 adjacent the corresponding TSV 204, and a third portion 248 of the seed/barrier structure 240 in contact with the second portion 234 of the first passivation material 220. In some embodiments, the grooves 242 can be ring-shaped. In other embodiments, the grooves 242 can have any suitable size or shape or any combination of sizes and shapes. Additionally, in some embodiments, the shapes of the grooves 242 correspond to the cross-sectional shapes of the corresponding TSV 204. In other embodiments, the individual grooves 242 have a shape that is different than the cross-sectional shape of the corresponding TSV 204 (yet still surrounds at least a portion of the corresponding TSV 204).

Figure 2H:
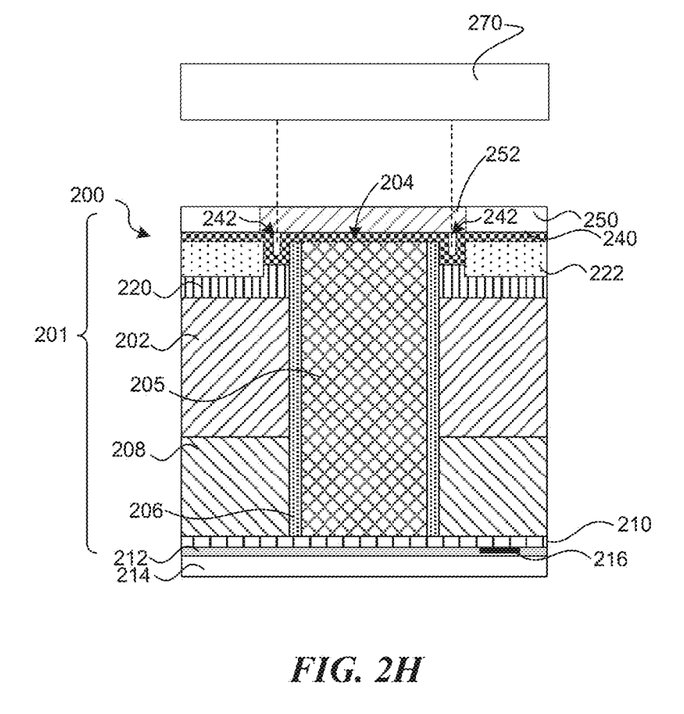
Figure 2I:
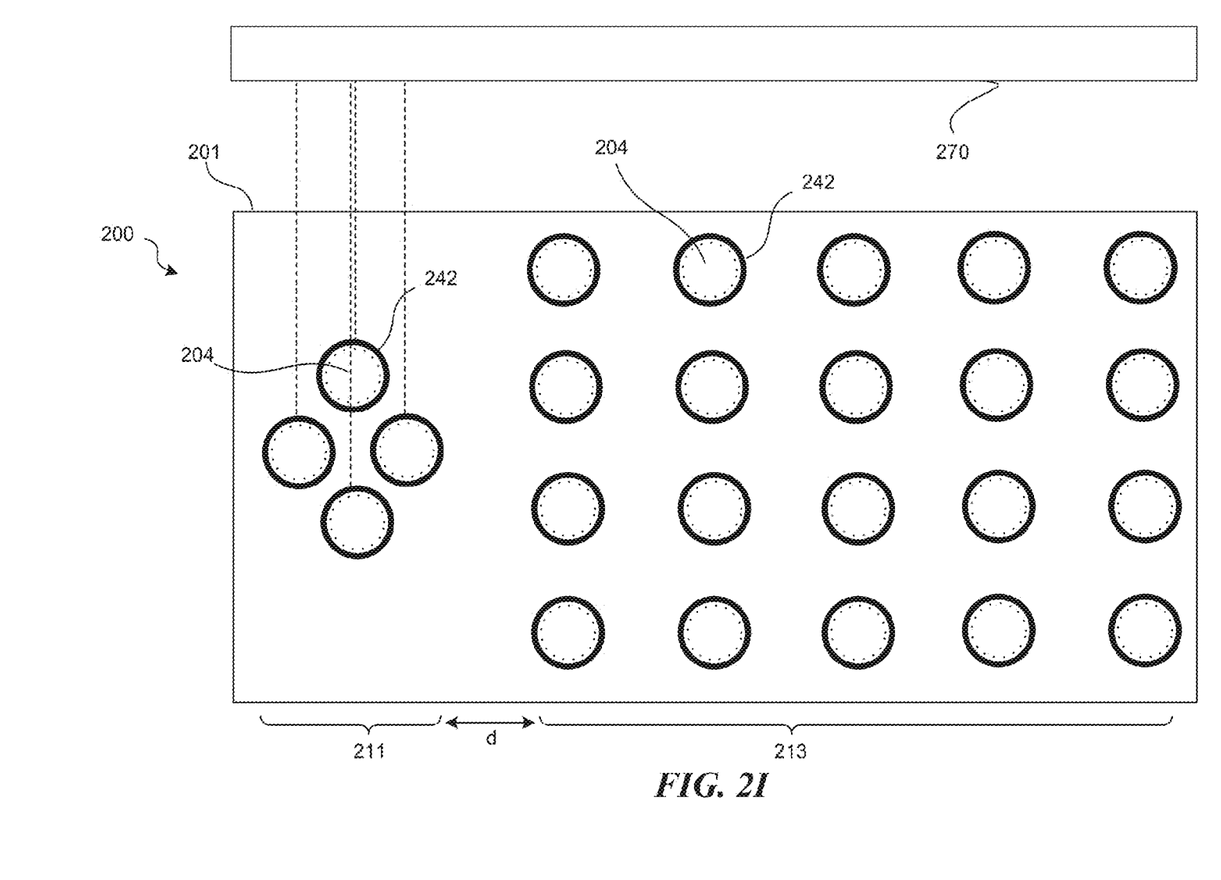
FIG. 2I is a schematic top view of the microelectronic substrate shown in FIGS. 2A-2H undergoing a process for aligning an electrical feature to a TSV in accordance with embodiments of the technology.

FIG. 2H is a cross-sectional side view of a portion of the workpiece 200 after a resist material 250 has been formed on the seed/barrier structure 240. A photolithography tool 270 positioned at a backside of the device 201 can identify the grooves 242 corresponding to the first group 211 of TSVs through the resist material 250 and, based on the known relative positions between the first group 211 and the second group 213, align a pattern to expose an incident portion 252 of the resist material 250 superimposed with the TSVs 204. For example, FIG. 2I is a schematic plan view of the workpiece 200 showing the grooves 242 in solid lines (to denote being identifiable to the photolithography tool) and the corresponding TSVs 204 in dashed lines (to denote not being directly identifiable by the photolithography tool). As shown in FIG. 2I, the photolithography tool can align itself to the grooves 242 corresponding to the first group 211 of TSVs 204. Moreover, in some embodiments, the resist material 250 is deposited and only the second group 213 is exposed. Regardless, the process described above with respect to the first group 211 of TSVs eliminates a photo-patterning step to create a second fiducial (compared to the prior art) such that the photolithography tool can accurately pattern the backside of the device 201.

Figure 2J:
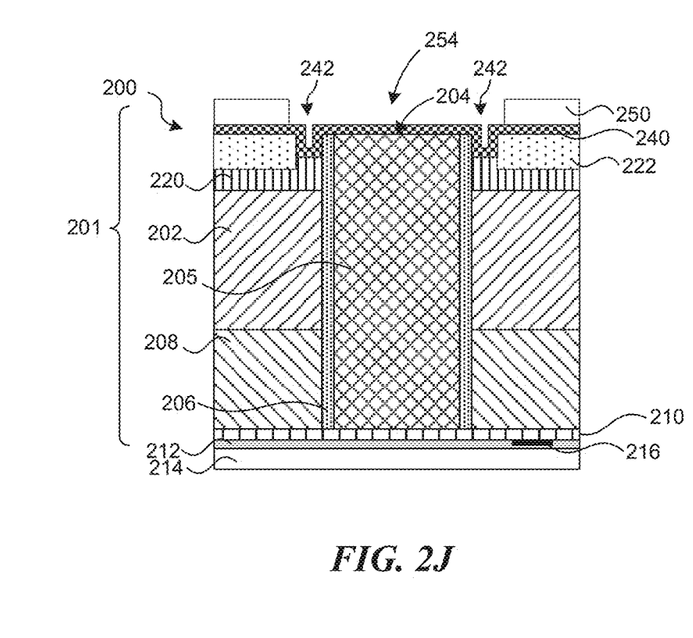
FIGS. 2J and 2K are schematic cross-sectional side views of a portion of the microelectronic substrate shown in FIGS. 2A-2I undergoing a process for aligning an electrical feature to a TSV in accordance with embodiments of the present technology.
Figure 2K:
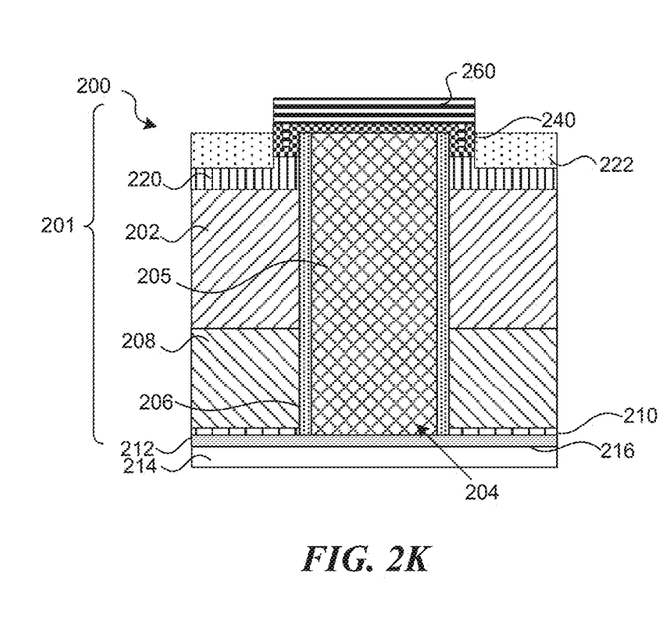

FIG. 2J shows a portion of the workpiece 200 once the incident portions 252 of the resist material 250 have been removed to form openings 254 in the resist material 250 that are aligned with a corresponding the TSV 204. As shown in FIG. 2K, UBM structures 260 can then be formed in the openings 254 and the remaining resist material 250 can be removed. The UBM structures 260 promote bonding of die-to-die TSVs, and can include, for example, layers of nickel/palladium/gold or other alloys.

In some embodiments, the UBM structure 260 can be formed only on the second group 213 of TSVs 204. In such embodiments, the first group 211 of TSVs 204 can be electrically passive (i.e., dummy TSVs), and the second group 213 can be electrically active. In other embodiments, the UBM structures 260 can be formed on both groups 211, 213 and only the second group 213 can be electrically connected to additional microelectronic structures.

The method and resulting device shown in FIGS. 2A-2K is expected to have several advantages in addition to cutting time, cutting cost, and increasing product yield. First, the current method enhances reliability of the device because the thicker first passivation material lowers the aspect ratio and thus reduces the possibility of voiding. Second, in conventional systems, areas of the substrate 202 can be exposed because of over-polishing during oxide CMP. The thicker first passivation material of the present technology can help prevent the occurrence of over-polishing. Third, by preventing over-polishing, the TSV material is not smeared across the wafer during CMP processing.

Figure 3A:
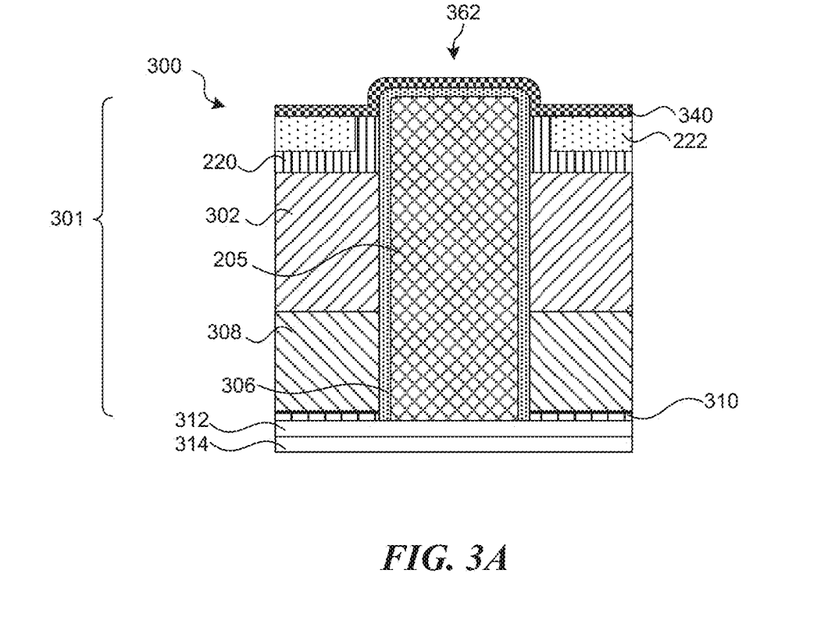
FIG. 3A is a schematic cross-sectional view of a portion of a microelectronic substrate undergoing a process for aligning an electrical feature to a TSV in accordance with embodiments of the technology.
Figure 3B:
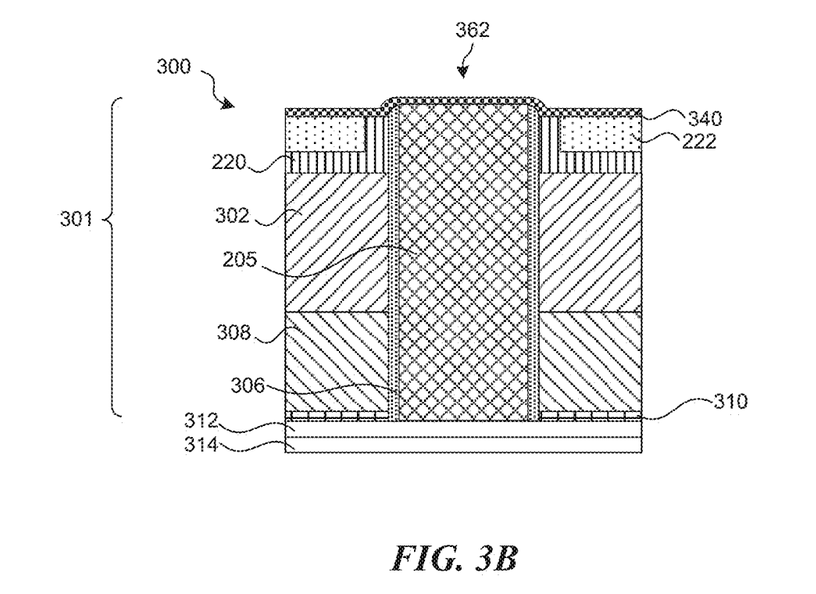
FIG. 3B is a schematic cross-sectional view of a portion of a microelectronic substrate undergoing a process for aligning an electrical feature to a TSV in accordance with embodiments of the technology.

FIG. 3A is a cross-sectional side view of a portion of a workpiece 300 configured in accordance with another embodiment of the present technology. The workpiece 300 and semiconductor device 301 can be generally similar to the workpiece 200 and semiconductor device 201 described in FIGS. 2A-2D, and like reference numerals refer to the components. However, instead of planarizing the first passivation material 220, second passivation material 222, and the TSV 204 (as described in FIG. 2E), the first and second passivation materials 220, 222 can be selectively etched or otherwise removed from a backside surface of the device 301 such that the TSV 204 extends beyond the backside surfaces of the first and second passivation materials 220, 222. FIG. 3B is a cross-sectional side view of a workpiece 300 in accordance with another embodiment of the present technology. In this embodiment, the first and second passivation materials 220, 222 are removed using a CMP process that removes the first and second passivation materials 220, 222 faster than the barrier material 306. As such, a portion of the TSV 204 projects beyond the backside surface of the first and second passivation materials 220, 222.

As shown in FIGS. 3A and 3B, a seed material 340 can be deposited onto the backside surface of the device 301 and can generally conform to the backside topography of the device 301. As such, the device 301 includes a protrusion 362 on the backside topography defined by the TSV 204 itself. The protrusion 362 can be identified by a photolithography tool for subsequent alignment. Accordingly, the sidewalls of the protrusion 362 can define a self-aligned alignment feature. As such, without the presence of a second fiducial, the photolithography tool can accurately pattern the backside of the device 301.

Figure 4:
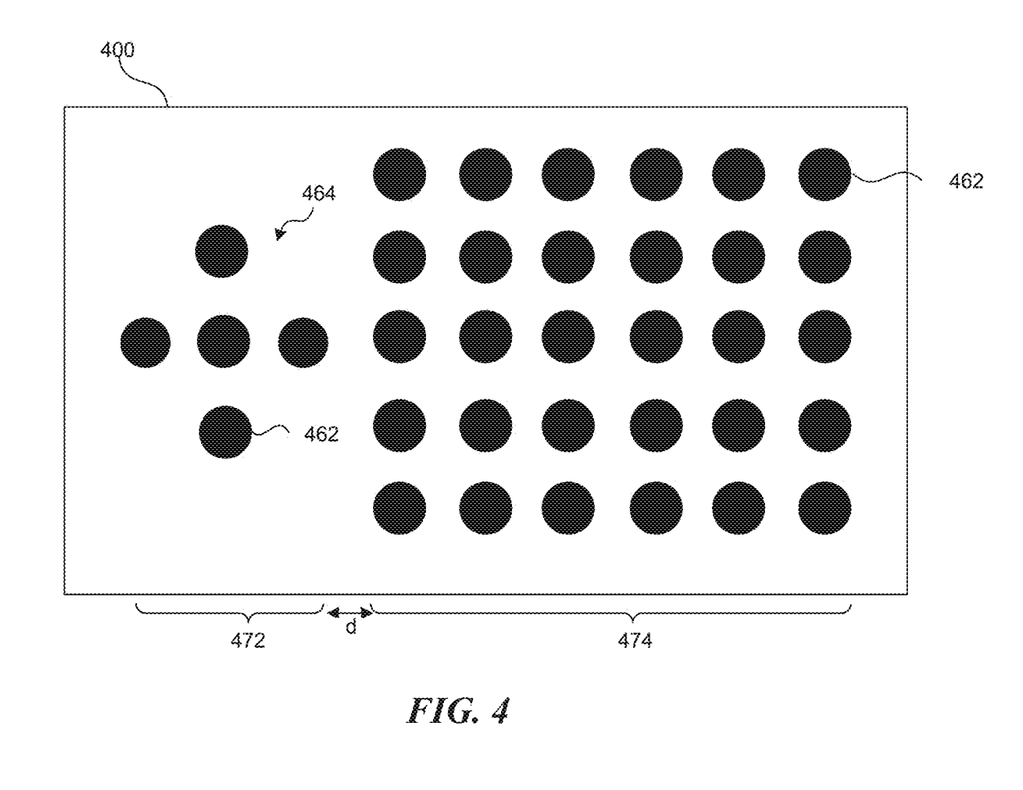
FIG. 4 is a schematic top view of a semiconductor wafer undergoing a process for aligning an electrical feature to a TSV in accordance with embodiments of the technology.
Figure 5:
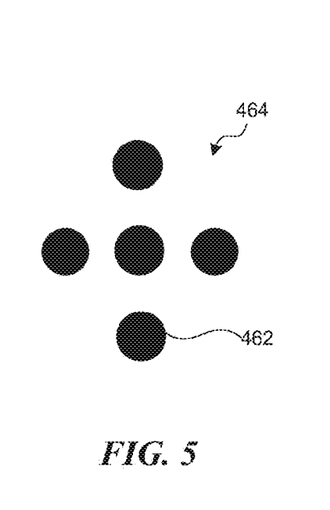
FIGS. 5-8 are schematic top views of various embodiments of an alignment pattern in accordance with embodiments of the present technology.
Figure 6:
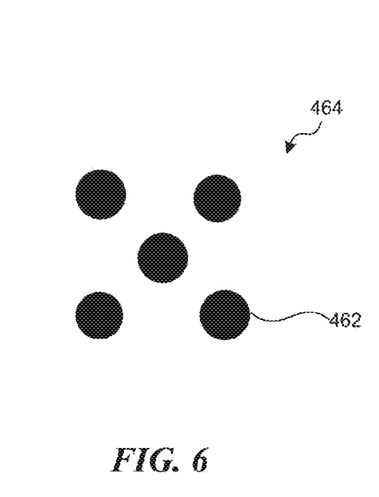
Figure 7:
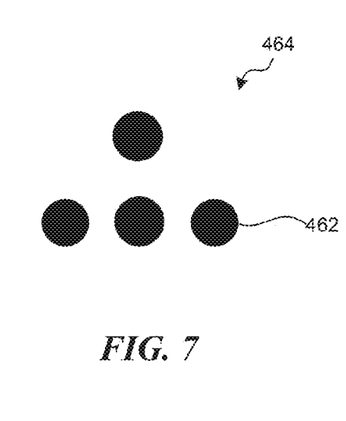
Figure 8:
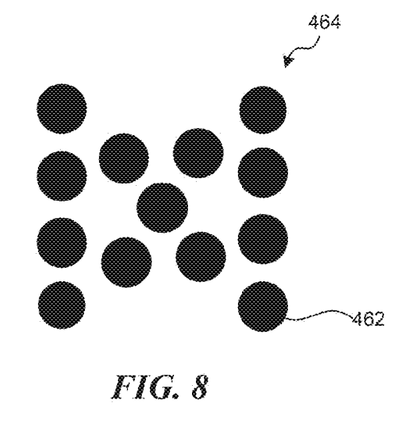

FIG. 4 is a top view of a semiconductor wafer 400 having a plurality of protrusions 462 identical to those described with reference to FIG. 3. The wafer 400 can include an alignment portion 472 and a TSV portion 474 separated by a distance d. For example, in some embodiments, the alignment portion 472 and the TSV portion 474 could be separated by one pitch (i.e., the distance between the center of two adjacent TSVs). In other embodiments, the alignment portion 472 and the TSV portion 474 can be separated by more than one pitch. The alignment portion 472 can include an alignment pattern 464 having a distinct configuration of TSVs. For example, in FIG. 4, the alignment portion 472 includes five protrusions 462 arranged in the shape of a cross. The alignment pattern 464 can be identified by a photolithography tool and used to align the tool over the entire wafer 400. For example, in certain scenarios, the one or more protrusions 462 within the TSV portion 474 may not be identifiable to the photolithography tool. However, because of the alignment pattern 464 created by the protrusions 462, the photolithography tool can still align itself accordingly. In some embodiments, the protrusions comprising the alignment pattern 464 are configured to only serve as an alignment feature and not for electrical connections.

Although an alignment pattern in the shape of a cross is shown in FIG. 4, in other embodiments the alignment pattern can have any pattern or configuration configured to distinguish the protrusions comprising the alignment pattern from the protrusions comprising the TSV portion (such as those shown in FIGS. 5-8).

From the foregoing, it will be appreciated that specific embodiments of the technology have been described herein for purposes of illustration, but that various modifications may be made without deviating from the disclosure. For example, although the methods described herein refer to aligning an electrical feature to an exposed TSV at the backside of a semiconductor device, these methods could be utilized to create an alignment feature at the frontside of the device. Also, many of the elements of one embodiment may be combined with other embodiments in addition to or in lieu of the elements of the other embodiments. Accordingly, the disclosure is not limited except as by the appended claims.

We claim:

1. A method for aligning an electronic feature to a through-substrate via ("TSV") extending through a semiconductor substrate on a microelectronic device, the method comprising:
    forming the TSV through a semiconductor substrate, the TSV having a protruding portion that projects beyond a backside surface of the semiconductor substrate;
    depositing a first passivation material over the backside surface of the semiconductor substrate and the protruding portion of the TSV;
    depositing a second passivation material on the first passivation material;
    removing a portion of the first passivation material and the second passivation material, thereby exposing the protruding portion of the TSV;
    forming a self-aligned alignment feature having a wall around at least a portion of the TSV;
    depositing a seed material on the second passivation material, wherein the seed material is electrically coupled to the TSV, and wherein the seed material conforms to the wall of the self-aligned alignment feature; and
    aligning a photolithography tool to the self-aligned alignment feature.

2. The method of claim 1 wherein, after removing a portion of the first and second passivation materials, the backside surface of the TSV projects beyond the first passivation material and the second passivation material, and wherein a portion of the protruding portion of the TSV forms the wall of the self-aligned alignment feature.

3. The method of claim 1, further comprising:
depositing a resist material on the seed material; and
creating an opening in the resist material, wherein the opening exposes the protruding portion of the TSV.

4. The method of claim 1, further comprising:
depositing a resist material on the seed material;
creating an opening in the resist material, wherein the opening exposes the protruding portion of the TSV; and
forming an under-bump metallization ("UBM") structure in the opening on an exposed portion of the protruding portion of the TSV.

5. The method of claim 1 wherein:
removing a portion of the first passivation material and the second passivation material comprises planarizing the first and second passivation materials until the TSV is exposed;
forming a self-aligned alignment feature includes removing a portion of the first passivation material such that a recess is formed in the first passivation material between the second passivation material and the TSV.

6. The method of claim 1, further including creating a recess in the first passivation material that at least partially surrounds the TSV.

7. The method of claim 6 wherein the recess is formed by selectively etching the first passivation material relative to the second passivation material.

8. The method of claim 6 further comprising:
depositing a resist material on the seed material;
creating an opening in the resist material aligned with the protruding portion of the TSV; and
forming an under-bump metallization ("UBM") structure on the seed material in the opening.

9. The method of claim 1, wherein forming the self-aligned alignment feature includes
changing a height of the TSV, the first passivation material, or the second passivation material relative to one another such that a topographical relief defining the self-aligned alignment feature is formed.

10. The method of claim 9, wherein the method does not include forming a fiducial at the backside of the device.

11. The method of claim 9 wherein:
changing the height includes simultaneously etching the first passivation material to a first height and the second passivation material to a second height, wherein the first height is less than the second height.

12. The method of claim 9, wherein the method does not include forming a fiducial at the backside of the device using a separate photo-lithography process to position the fiducial at the backside of the device.

13. A method for aligning an electronic feature to a plurality of through-substrate via ("TSV") extending through a semiconductor substrate on a microelectronic device, the method comprising:
forming the TSVs through a semiconductor substrate, the TSVs each having a protruding portion that projects beyond a backside surface of the semiconductor substrate;
depositing a first passivation material over the backside surface of the semiconductor substrate and the protruding portions of the TSVs;
depositing a second passivation material on the first passivation material;
removing a portion of the first passivation material and the second passivation material, thereby exposing the protruding portions of the TSVs;
forming a plurality of self-aligned alignment features, each having a wall around at least a portion of the corresponding TSV;
depositing a seed material on the second passivation material, wherein the seed material is electrically coupled to the TSVs, and wherein the seed material conforms to the wall of the corresponding self-aligned alignment feature; and
aligning a photolithography tool to a subset of the self-aligned alignment features, wherein the subset has a unique arrangement that is identifiable to the photolithography tool.

* * * * *